United States Patent
Sotgiu et al.

(10) Patent No.: US 9,881,106 B2
(45) Date of Patent: *Jan. 30, 2018

(54) DETERMINATION OF BEHAVIOR OF LOADED WHEELS BY LOAD SIMULATION

(71) Applicant: Snap-on Equipment Sri a unico socio, Correggio (IT)

(72) Inventors: Paolo Sotgiu, Modena (IT); Francesco Braghiroli, Reggio Emilia (IT); Marco Tralli, Modena (IT)

(73) Assignee: SNAP-ON EQUIPMENT SRL A UNICO SOCIO, Correggio (RE) (IT)

( * ) Notice: Subject to any disclaimer, the term of this patent is extended or adjusted under 35 U.S.C. 154(b) by 917 days.

This patent is subject to a terminal disclaimer.

(21) Appl. No.: 14/354,083

(22) PCT Filed: Oct. 25, 2012

(86) PCT No.: PCT/EP2012/071166
§ 371 (c)(1),
(2) Date: Apr. 24, 2014

(87) PCT Pub. No.: WO2013/060782
PCT Pub. Date: May 2, 2013

(65) Prior Publication Data
US 2014/0303908 A1    Oct. 9, 2014

(30) Foreign Application Priority Data
Oct. 25, 2011  (EP) ..................................... 11008537

(51) Int. Cl.
*G06G 7/48* (2006.01)
*G06F 17/50* (2006.01)
(Continued)

(52) U.S. Cl.
CPC ....... *G06F 17/5009* (2013.01); *B60G 17/019* (2013.01); *G01B 21/32* (2013.01); *G01M 17/02* (2013.01)

(58) Field of Classification Search
CPC ..... B60G 17/019; G01B 21/32; G01M 17/02; G06F 17/5009
(Continued)

(56) References Cited

U.S. PATENT DOCUMENTS 4,016,020 A * 4/1977 Ongaro ................... B24B 5/366
156/154
4,704,900 A   11/1987 Beebe
(Continued)

FOREIGN PATENT DOCUMENTS

| JP | 2001-356080 A | 12/2001 |
|---|---|---|
| JP | 2006-123644 A | 5/2006 |
| JP | 2009-020123 A | 1/2009 |

OTHER PUBLICATIONS

International Search Report PCT/EP2012/071166 dated Dec. 7, 2012.
(Continued)

*Primary Examiner* — Andre Pierre Louis
(74) *Attorney, Agent, or Firm* — McDermott Will & Emery LLP

(57) ABSTRACT

The invention relates to a method for contactless determining a behavior of a loaded tire or wheel, comprising the steps of determining a contour of at least a portion of the tire or wheel; simulating loading of the tire or wheel with a virtual loading element bearing against the tire for at least one rotary position of the wheel on the basis of the determined contour, a displacement of the determined contour caused by the virtual loading element and at least one parameter associated to the tire or wheel or to a part of the tire; and
(Continued)

determining the behavior of the loaded wheel using the simulation results.

34 Claims, 6 Drawing Sheets

(51) Int. Cl.
    *G01B 21/32*     (2006.01)
    *G01M 17/02*     (2006.01)
    *B60G 17/019*     (2006.01)

(58) Field of Classification Search
    USPC ............ 703/6, 7, 8; 73/66, 146, 461, 462;
                    700/279; 701/41; 152/154.1; 156/75;
                    72/353.4
    See application file for complete search history.

(56) References Cited

U.S. PATENT DOCUMENTS

| | | | | |
|---|---|---|---|---|
| 5,568,745 A | * | 10/1996 | Daudi | B21D 53/26 |
| | | | | 72/353.2 |
| 6,360,593 B1 | * | 3/2002 | Schoenfeld | G01M 17/022 |
| | | | | 73/146 |
| 6,397,675 B1 | | 6/2002 | Colarelli et al. | |
| 2002/0100321 A1 | * | 8/2002 | Douglas | G01M 17/022 |
| | | | | 73/461 |
| 2003/0005764 A1 | * | 1/2003 | Colarelli, III | G01M 17/022 |
| | | | | 73/462 |
| 2003/0036834 A1 | * | 2/2003 | Kunsch | F16F 15/324 |
| | | | | 701/41 |
| 2004/0068397 A1 | | 4/2004 | Ohsawa | |
| 2005/0262933 A1 | * | 12/2005 | Zhu | G01M 17/022 |
| | | | | 73/146 |
| 2008/0119962 A1 | * | 5/2008 | Voeller | B60C 11/24 |
| | | | | 700/279 |
| 2009/0272471 A1 | * | 11/2009 | Bormann | G01M 1/365 |
| | | | | 152/154.1 |
| 2011/0023589 A1 | * | 2/2011 | Seitz | G01M 1/30 |
| | | | | 73/66 |
| 2011/0056284 A1 | | 3/2011 | Hanada et al. | |
| 2012/0186324 A1 | * | 7/2012 | Neugebauer | G01N 3/56 |
| | | | | 73/8 |

OTHER PUBLICATIONS

Written Opinion of the International Searching Authority PCT/EP2012/071166 dated Dec. 7, 2012.
Japanese Office Action dated Dec. 3, 2015, issued in Japanese Application No. 2014-537616. (w/ English translation).
Communication Pursuant to Article 94(3) EPC dated May 10, 2017, issued in European Patent Application No. 12778724.0.

\* cited by examiner

DETERMINATION OF BEHAVIOR OF LOADED WHEELS BY LOAD SIMULATION

CROSS REFERENCE TO RELATED APPLICATIONS

This application is the U.S. National Phase of PCT/EP2012/0171166, which claims priority from EP Application No. 11008537.5 filed Oct. 25, 2011. The subject matter of each of these applications are incorporated herein by reference in their entirety.

BACKGROUND OF THE INVENTION

Field of the Invention

The invention relates to a method for determining the behavior of a loaded tyre or wheel, in particular a pneumatic motor vehicle tyre or wheel, the wheel or wheel assembly comprising a rim and a tyre mounted to the rim. The behavior in this context relates to radial or lateral forces acting on the loaded wheel, deformations of the tyre or wheel resulting from load, radial or lateral runout of the loaded wheel, or any other behavior or effect resulting from a load exerted onto the tyre or wheel. Furthermore, the invention relates to a system or an apparatus for carrying out such methods. In particular, the invention relates to an improved method and apparatus for determination of said behavior of a wheel under load by simulating the loading.

Description of the Related Art

Even when a pneumatic motor vehicle wheel is balanced, non-uniformity in the construction of the tyre and also runout of the wheel rim can result in significant vibration forces when the wheel is rolling under load, what is the normal operation condition. The assumption that a wheel/tyre assembly which is suitably balanced under no-load condition will also be suitably balanced when installed on a vehicle and subjected to a substantial load resulting from the vehicle weight, is not necessarily valid.

Non-uniformities in the behavior of a loaded wheel can result from radial or lateral runout of the tyre and/or the rim as well as variations in tyre stiffness caused by non-uniformities of tyre construction such as variations in the carcass or the tyre wall thickness (tyre structure), for example. Such non-uniformities cause variations in the rolling diameter of the loaded wheel along the circumference, i.e. within one revolution of the wheel. This results in vertical movements of the wheel axis, and thus vertical vibration forces acting on the wheel suspension of a driving vehicle.

It is desirable to determine said non-uniformities of a loaded wheel such as force variations and/or runout. Then the determined non-uniformities can be used during the operation of a wheel balancer or a tyre changer to correct the magnitudes or locations of balancing weights or to identify an angular remount position of the rim/tyre assembly, for example. Thus, disadvantageous effects of said non-uniformities of a loaded wheel can be mitigated or even eliminated.

A wheel balancer for determining non-uniformities such as radial force variations or radial runout of rolling loaded wheels is known from U.S. Pat. No. 6,397,675. With this wheel balancer, a load roller is provided for applying a substantial radial force to the rim/tyre assembly (wheel) during rotation of the wheel. Movement of the load roller during rotation of the wheel is observed to measure radial runout of the loaded wheel. Furthermore, vibration forces of the rolling loaded wheel are measured by the vibration sensors of the wheel balancer.

Providing a load roller to measure loaded rolling wheels under realistic conditions requires massive construction of a corresponding measuring apparatus because of the strong forces typically applied to the wheel by the load roller. This results in a heavy and bulky apparatus and increases costs.

SUMMARY OF THE INVENTION

It is an object of the present invention to provide an improved method and system for determining the behavior of a wheel due to a load without requiring application of strong forces to the wheel.

In accordance with the invention, that object is solved by a method according to claim 1 and a system according to claim 23. The dependent claims refer to further developments of the invention.

In a first aspect, the invention provides a method for determining a behavior of a loaded tyre or wheel comprising a rim and a tyre mounted to the rim, the method comprising the steps of determining a contour of at least a portion of the tyre or wheel, simulating loading of the tyre or wheel with at least one virtual loading element bearing against the tyre for at least one rotary position of the tyre or wheel on the basis of the determined contour, a displacement of the determined contour caused by the virtual loading element, and at least one parameter associated to the tyre or wheel or to a part of the tyre, and determining the behavior of the loaded tyre or wheel using the simulation results.

Non-uniformities of the tyre structure usually result in or are accompanied by non-uniformities of the shape of the tyre both in an unloaded condition and in a loaded condition. In other words, the behavior of a tyre or wheel under load depends on its structure which in turn can be at least in part derived from its shape or from non-uniformities of its shape. The contour can be determined by a scanning device which scans the surface of the tyre or wheel, for example an optical scanning device providing three dimensional data about the scanned surface.

The load simulation can be based on a contour of any portion of the tyre. Examples for the contour used for simulation may be, but are not restricted to, an inner contour of the tyre opposite to the tread surface, or an inner contour of the sidewalls and the bead region, as well as an outer contour comprising at least a part of the tyre tread surface and/or the sidewalls of the tyre, or a contour corresponding to the diameter of the wheel can be used. Considering the sidewalls of the tyre may improve simulation accuracy because the contour of the side walls allows conclusions on tyre deformation under load and tyre stiffness, for example. The location, extension and shape of the contour to be determined and to be used for simulation may be chosen according to the intended application, or according to the aspects of behavior of the tyre or wheel which is to be determined.

In a further development of the invention, both inner and outer contours of portions of the tyre can be determined so that a wall thickness of the respective tyre portions can be determined. Having data about the wall thickness of tyre portions enables a very precise simulation considering local tyre wall stiffness and tyre deforming prediction. This can be based on finite element calculations, for example.

In another independent further development of the first aspect of the invention, deformation of the whole tyre caused by loading the tyre or wheel at a respective rotary position can be simulated in order to achieve more precise results. To this purpose, the ring model of a tyre can be used which is known in the field of tyre technology. This ring model describes the deformation of a whole tyre under load and allows in connection with the determined contour or wall thickness of tyre portions to calculate displacements of tyre portions resulting from the simulated load situation and the corresponding forces acting on the respective tyre portions.

During the determination of the contour of at least a portion of the tyre or wheel, the tyre or wheel preferably is in an unloaded state. However, it is also possible to determine the contour in a loaded state of the wheel in which the wheel is loaded by a physical load roller or load plate, or while the wheel is bearing on a road surface under load (for example when mounted on a vehicle). In this case, an unloaded part of the tyre or wheel can be scanned to determine the contour, the unloaded part being positioned opposite the physical loading element or road surface, or positioned in any rotary angle position thereto with respect to the wheel. However, it is also possible to determine the contour of the loaded portion of the tyre, i.e. the portion deformed and displaced by a physical loading element or by the road surface (for example by optically scanning the tyre surface through a see-through loading element, or by scanning the tyre portions adjacent to the loading element and assuming a deformation of the tyre according to the known surface shape of the loading element in the region of the contact area between tyre and loading element).

In an independent further development of the invention, it is possible to first determine a contour in an unloaded state and then load the wheel with a known load while determining the contour again. Thereby, the wheel preferably does not rotate. This allows a simple mechanical structure of the test equipment and avoids physical wear of tyre and test equipment. In this manner, certain tyre parameters can be determined or estimated in advance, such as spring rates, filling pressures, deforming factors or other parameters which can be used for the following load simulations according to the method invention. This enables adapting or calibrating the apparatus and the method of the invention with respect to changing conditions such as tyre type, filling pressure and so on.

When simulating loading of the tyre or wheel with the virtual loading element, the virtual loading element is preferably born against the tread of the tyre. However, it is also possible to bear the virtual loading element against any other part of the tyre such as a side wall instead of or additionally to bearing the virtual loading element against a tread portion, in order to achieve more information about the behavior of the tyre under load or to enhance precision of the simulation results by additional information. Furthermore, it is also possible to use more than one loading element simultaneously in order to simulate arbitrary loading situations.

In another independent further development of the invention, a separate tyre (being not mounted to a rim) can be scanned to determine the contour of at least one portion of the tyre comprising the inner and/or outer surface of the tread, the side walls and the beads of the tyre. In this manner, it is possible to simulate loading of the wheel independent of a physical rim by means of at least two virtual loading elements. In this case, one virtual loading element may represent a rim and will be born against the tyre beads, while another virtual loading element may represent a load roller or a road surface and will be born against the outer tread surface, for example. With this method, virtual rims having different characteristics (such as spring rate of the rim, rim width, shape of the rim edges and so on) can be used for determining a behavior of the tyre.

Preferably, the tyre or wheel is scanned at a plurality of rotary positions around its circumference to achieve a complete contour of the tyre or wheel. This enables determination of variations of the tyre behavior along its circumference. However, it is also possible to scan the contour of only one rotary position of the tyre or wheel for gaining helpful information about behavior of the tyre or wheel. In this case, the determined contour can be assumed to be constant along the circumference of the tyre or wheel. For improving that simplified method of the invention, the single rotary position the contour of which is to be determined may be chosen to coincide with that of the maximum radial runout or other parameters of choice.

The at least one parameter associated to the tyre or wheel or to a part of the tyre comprises at least one of a spring rate associated to the rim, a filling pressure of the tyre, a spring rate associated to the tyre, a spring rate associated to a portion of the tyre, a displacement of the determined contour caused by the virtual loading element, a wall thickness of respective portions of the tyre, and a deformation of the determined contour caused by the virtual loading element.

The behavior of the tyre or wheel which is determined by the method of the invention comprises at least one of a force exerted between the tyre and the virtual loading element, a force exerted between the tyre and the rim, a force exerted by the rim or wheel on a rotary axis of the wheel, a deformation or displacement of the tyre or of a portion of the tyre, a deformation of the rim, a variation of one of said forces or deformations or displacements with respect to a plurality of load simulations relating to a plurality of rotary positions of the tyre or wheel. That forces or deformations or displacements may be determined in at least one of a radial direction, a lateral direction, and a circumferential direction with respect to the tyre or wheel. Furthermore, the behavior may comprise at least one of an average, a peak to peak value, a first harmonic, and a higher harmonic of at least one of said variations of said forces or deformations or displacements.

In another independent further development of the first aspect of the invention, the step of simulating loading for a respective rotary position of the tyre or wheel comprises simulating a plurality of different load conditions, wherein the different load conditions preferably comprise different or varying load magnitudes and/or different or varying values of the at least one parameter associated to the tyre or wheel or to a part of the tyre. Additionally, the step of simulating may further comprise determining a simulation result for each respective rotary position of the tyre or wheel on the basis of a plurality of simulations of different load conditions, preferably by averaging.

In the following text of the description, non-uniformities of the tyre or wheel are to be understood as an example for the behavior of the tyre or wheel. Therefore, the term non-uniformity has to be interpreted in the broad sense of a tyre or wheel behavior resulting from loading the tyre, if not restricted to special non-uniformities (such as radial or lateral runout of geometry or radial force, for example) in the technical context.

In a further development of the first aspect, the method comprises the steps of determining outer contour of at least a portion of the unloaded wheel, the portion comprising at least a tread of the tyre, simulating loading of the wheel with a virtual loading element bearing against the tyre tread for a plurality of rotary positions of the wheel on the basis of the determined outer contour, a displacement of the determined outer contour caused by the virtual loading element, and a predetermined spring rate associated to the tyre tread, and determining non-uniformities of the loaded wheel using the simulation results.

In other words, in a first step, the outer contour of a wheel is scanned and contour data of the wheel are obtained. The contour data may comprise a plurality of radial cross sections of the outer contour of the wheel or of the scanned portion of the wheel in a two dimensional representation, wherein each radial cross section is associated to a certain rotary position of the wheel. In a next step, one of the radial cross sections of the contour data is considered and a virtual loading element represented by a line parallel to the wheel axis is virtually moved in radial direction to the wheel axis thereby displacing and deforming the radial cross section of the outer contour, in particular the tread portion of the same. Since the tyre provides resistance to such a deformation and displacement of the outer contour because of the tyre inflation pressure and tyre material stiffness, the virtual displacement of each individual (infinitesimal) portion of the radial cross section of the outer contour caused by the advancing virtual loading element can be represented by a displacement (compression) of a small virtual spring having a certain predetermined spring rate. A force required to displace the individual portion of the outer contour to the extent effected by the virtual loading element may be derived from the displacement distance with respect to the unloaded position by means of the predetermined spring rate and Hook's Law. Integrating the individual (infinitesimal) forces of the individual contour portions along the radial cross section of the outer contour leads to total force which is required to move and hold the virtual loading element in the considered position. Thus, a total load force associated to a certain loading element position having a certain distance to the wheel axis is obtained. Alternatively, it is also possible to gradually advance the virtual loading element in direction to the wheel axis until a certain total load force is achieved. Thus, a loading element position associated to a certain total load force is obtained. This is repeated for each rotary position of the wheel to obtain a respective total load force, or alternatively a respective loading element position, associated to the radial cross section of the outer contour determined for that rotary position of the wheel. Since in reality a wheel is not perfectly symmetric and not perfectly circular, the radial cross sections of the outer contour associated to different rotary positions of the wheel may be different. This results in different values of the total load force or the loading element position, respectively. Thus, for example, a varying radial force (load force) or a varying rolling radius of a wheel rolling under load can be determined from the plurality of load forces or loading element positions, respectively, determined according to the simulation described above.

By simulated loading the wheel with a virtual loading element, it is not necessary to provide a real load roller so that a measuring apparatus can be less bulky and heavy and the costs of such an apparatus can be reduced. This is valid in particular in the case of a vehicle service machine already comprising a scanning device capable of scanning the outer contour of the wheel to be handled.

In a further development of the invention, the step of simulating comprises simulated loading the wheel with a predetermined force exerted by the virtual loading element, while the step of determining non-uniformities comprises determining radial runout of the loaded wheel. This corresponds to a realistic operation condition where the wheel is loaded with a certain weight of the driving vehicle. Thus, for example, vertical movement of the wheel axis during low speed driving can be estimated, when the damping effect of the suspension system does not substantially mitigate such movement.

According to a further aspect of the invention, the simulating step may comprise varying and setting a displacement of the determined outer contour for respective rotary positions of a wheel caused by the virtual loading element so that a load force calculated from the displacement and the predetermined spring rate is constant for all rotary positions of the wheel, while the step of determining non-uniformities comprises determining at least one of a variation of tread displacement and a varying distance of the virtual loading element to the rotation axis of the wheel varying along the circumferential direction of the wheel.

In another independent development of the invention, the step of simulating comprises simulated loading the wheel while a predetermined distance between the virtual loading element and a rotation axis of the wheel is provided, and the step of determining non-uniformities comprises determining radial force variation of the loaded wheel. This corresponds to a realistic operation condition where the loaded wheel is rolling with a substantially constant distance between the wheel axis and the road surface. Thus, for example, vertical vibration forces acting on the suspension system during high speed driving can be estimated, when the damping effect of the suspension system substantially mitigates vertical movements of the wheel axis.

According to another independent aspect of the invention, the simulating step may comprise keeping constant the distance between the virtual loading element and the wheel axis and calculating a respective load force for all rotary positions of the wheel from the predetermined spring rate and the displacement of the determined outer contour caused by the virtual loading element, while the step of determining non-uniformities comprises determining from said load forces varying along the circumferential direction of the wheel a radial force variation of the loaded wheel.

In another, independent development of the invention, the step of determining non-uniformities further comprises determining at least one of lateral force variation or lateral runout of the loaded wheel. Thus, lateral forces influencing the driving stability and in particular the directional stability of the vehicle can be evaluated.

In an independent further development of the invention said at least one parameter can be corrected according to at least one of a tyre type, a tyre size, a tyre inflation pressure and a rim type, a displacement of the virtual loading element, a displacement or deformation of the determined contour caused by the loading element, a kind of a vehicle, a vehicle weight, a repartition of the vehicle weight on the axles of the vehicle, a suspension geometry of the vehicle, and precise model data of the vehicle. All that parameters have more or less influence on the tyre stiffness and the local strength of the spring rate so that consideration of them further increases accuracy of the simulation. These parameters can be measured or determined automatically or can be input by the operator, for example, or may be derived from a data base.

According to a further aspect of the invention, which is independent from the previous aspects, the step of determining the outer contour of the wheel can comprise determining a radial runout and/or a lateral runout of the rim, wherein the step of simulating comprises consideration of the determined radial or lateral runout of the rim. Knowledge of radial or lateral runout of the rim is advantageous in order to separate the influence of the rim and the influence of the tyre on the determined outer contour of the wheel and the determined non-uniformities of the loaded wheel, respectively. Thus, load simulation can be increased in accuracy, and furthermore, an angular remount position of the rim/tyre assembly in order to mitigate or eliminate radial or lateral runout of the rim/tyre assembly can be determined, for example.

Furthermore, the predetermined spring rate associated to the tyre tread can be an infinitesimal spring rate which is assumed to be constant all over the tread surface, or can alternatively vary in accordance to an axial position of an associated tread portion. This variation of the spring rate can be accomplished by a corresponding weighting function. Thus, for example, the stronger influence of the edge portions in axial direction of the tread on the tyre stiffness and spring rate can be taken into account to increase accuracy of the load simulation. The edge portions in axial direction of the tread in general are stiffer, i.e. have a higher spring rate, because of the influence of the sidewalls of the tyre which are deformed when the edge portion of the tread are displaced.

Furthermore and independent from the above aspects, the predetermined spring rate associated to the tyre tread can be an infinitesimal spring rate which varies in accordance to a radial position of an associated tread portion. Also this variation of the spring rate can be accomplished by a corresponding weighting function. Thus, for example, the deviation of the tyre contour from a perfect circular circumference resulting from non-uniformities of the tyre structure can be taken into account to increase accuracy of the load simulation. Such non-uniformities in the tyre structure are assumed to not only result in tyre contour variations, but also in tyre stiffness variations. Therefore, there is a relationship between the radial position of an unloaded tread portion and its associated spring rate.

Furthermore and independent from the above aspects, the predetermined spring rate can be a non-linear infinitesimal spring rate varying in accordance to a displacement of the tyre tread caused by the loading. This advantageously takes into account that displacement of a tread portion in the beginning (i.e. small displacement) is influenced mainly by local geometrical deformations of the tyre material, while with larger displacements of the tread other factors such as the tyre inflation pressure and the tyre sidewall deformation gain influence with different strength. In this manner, accuracy of the load simulation can be increased.

According to a further aspect of the invention, the step of simulating can use the determined outer contour of a single radial cross-section of the wheel. In this manner, calculation and simulation of loading the wheel at the corresponding rotary position of the wheel is relatively simple and can provide sufficient accuracy of the results for several service applications, such as tyre diagnostics providing a simple good/bad evaluation, for example. To this, preferably appropriate assumptions for the required parameters, in particular the amount of the associated spring rate of the tread portion and its variation according to the axial position and/or the radial position as well as its non-linearity according to the tread displacement due to load may be made.

In a further development of the invention, which is independent from the other aspects, the step of simulating can use the determined outer contour of a plurality of adjacent radial cross-sections of the wheel to simulate a contact area between the virtual loading element and the tyre tread. In this manner, a more accurate load simulation can be achieved based on a more realistic tyre deformation due to load. Furthermore, it becomes possible to simulate loading of the wheel with virtual loading elements having different shape and take into account varying displacement of different tread portions and/or varying contact pressure within the contact area between the tyre tread and the surface of the virtual loading element. For example, load rollers with different diameters can be simulated, as well as a flat loading element representing a road surface. In particular simulating loading of the wheel with a flat loading element is advantageous since this is closer to the real operation conditions of a wheel running on a road surface.

The simulated contact area may be a contact area between the tyre and a virtual load roller having a certain radius, or between the tyre and a virtual load belt having a certain sagging radius between two supporting rollers, or between the tyre and a plane surface such as a road surface. Additionally, the contact area of the tyre and the respectively shaped virtual loading element may be simulated by applying a respective weighting function to the simulations of the respective adjacent radial cross sections of the tyre or wheel. Also other methods of considering the shape of the virtual loading element are feasible, such as adapting the local parameters used for simulation in dependence of the rotary position of the respective tyre portion with respect to the center of the contact area.

In a further aspect of the invention, an average outer contour of the unloaded wheel can be calculated from the scanned contour data representing a perfect circular wheel. From this average outer contour, deviations of the scanned outer contour can be determined and the predetermined spring rate associated to the tyre tread can be corrected, for example. Furthermore, the non-uniformities such as radial or lateral runout or radial or lateral force variations of the loaded wheel can be determined on the basis of a first harmonic of the deviations from the calculated average values. It is also possible to determine said non-uniformities on the basis of peak to peak values resulting from the load simulation.

In another independent further development of the invention, the loading of the tyre or wheel with the virtual loading element is adapted in dependence of vehicle parameters, such as overall vehicle weight, repartition of the vehicle weight on each vehicle axle, kind of vehicle, suspension geometry. To this, the displacement of the virtual loading element may be adapted, or the force exerted by the virtual loading element may be adapted, for example. It is also feasible to adapt the shape of the virtual loading element in dependence of vehicle parameters.

In another independent further development of the invention, the simulated contact area is a contact area between the tyre and a virtual load belt having a certain sagging radius, or between the tyre and a plane surface such as a road surface. Additionally, the contact area of the tyre and the respectively shaped virtual loading element may be simulated by applying a respective weighting function to the simulations of the respective adjacent radial cross sections of the tyre or wheel. Also other methods of considering the shape of the virtual loading element are feasible, such as adapting the local parameters used for simulation in dependence of the rotary position of the respective tyre portion with respect to the center of the contact area.

According to another aspect of the invention, a system for determining non-uniformities of a loaded wheel comprising a rim and a tyre mounted to the rim is provided. The system comprises a scanning device for scanning outer contour of the unloaded wheel, and a computer device connected to the scanning device. The computer device receives from the scanning device data representing the outer contour of the unloaded wheel and uses default values or measured or input values for the required parameters such as tyre inflation pressure, rim and tyre dimensions, rim and tyre type, and spring rate of the tyre tread and associated variations of the same, to simulate loading of the wheel and determine non-uniformities such as radial or lateral runout or radial or lateral force variations of the loaded wheel as set forth above.

The system can be a stand-alone system, or can be part of any tyre or wheel test equipment. Such a stand-alone system may be portable so that it may be used everywhere to evaluate quality of tyres. For example, it can be used in tyre manufacturing to evaluate the quality of the produced tyres. In this case, it is in particular advantageous that also a virtual rim can be used in simulation of the tyre behavior. Thus, it is possible to only scan the tyre surface (inner and/or outer contour) of a separate tyre without rim and to simulate the behavior of the tyre mounted to admissible rims without physically mounting the tyre onto a rim and without physically rotating the wheel assembly under load. Hence, a lot of time and costs can be saved.

The system can be an independent system or even a manageable or portable mobile system that can be positioned close to a wheel mounted to a vehicle and lifted from the floor to freely rotate the wheel. The wheel can be rotated by hand or by means of a technical device so that the scanning device of the system is able to scan the whole circumference of the wheel. Alternatively, the wheel may be kept fixed and the scanning device may be made to rotate around the wheel. According to another aspect of the invention, the system may be part of a test lane that does not require the vehicle to be lifted; rather, the wheel is put into rotation by the test lane rollers (such as a roller test bench, for example) and the whole circumference of the wheel is then scanned. With such configuration, rollers are used to transmit motion to the wheel, whereas wheel contour data acquisition is carried out in a non-contact manner by the scanning device. The corresponding rotary position of the wheel can be derived from the scanning data comprising identifiable features of the tyre or the rim so that an unambiguous assignment of the scanned surface contour to the associated rotary position is possible. Such a system is advantageous for quickly and convenient checking the uniformity characteristics of a wheel while mounted to a vehicle for diagnostic purposes, for example, and does not require demounting the wheel and mounting it to a rotatable support of a servicing apparatus such as a tyre changer or a wheel balancer.

According to another aspect of the invention, the system can be mounted on board of a vehicle. To this purpose, a scanning device for determining a contour of a tyre or wheel may be arranged in a wheel housing of the vehicle and may scan the tyre or wheel during operation of the vehicle. Rotary position information of the vehicle wheel for associating a scanned contour portion to a rotary angular position of the wheel may be obtained from other systems of the vehicle, such as the driving system or the brake system (ABS sensors). Information about behavior of a tyre obtained by such an on-board system may be used for informing the driver about wheel or tyre conditions, or for automatically adjusting the suspension system of the vehicle in order to improve the vehicle's driving characteristics, for example.

In another independent aspect of the invention, such an on-board system may communicate the obtained data about tyre or wheel behavior to any kind of automotive service equipment by wire or wireless, so that the data can be evaluated or used for service operations and decisions. For example, a vehicle wheel alignment system may use the tyre or wheel behavior data to improve the alignment process.

According to another aspect of the invention, the scanning device comprises an optical scanner capable of contactless sensing the outer surface of the wheel and providing three dimensional outer contour data of at least a portion of the wheel, the portion comprising at least a tread of the tyre. The scanning can be performed by a laser system or another optical system emitting a light beam onto the surface of the wheel. The scattered or reflected light returning from the wheel surface is received in an optical receiver, wherein the distance of the light impinging point on the wheel surface to the light source of the light receiver is determined according to methods known in the art. Thus, a three dimensional image or model of the wheel surface can be generated and represented in the form of three dimensional contour data.

Another possible scanning technology known in the art provides three dimensional contour data of the wheel surface by emitting a light beam in the form of a flat sheet (sheet of light technology) impinging on the wheel surface in the form of a thin line. This line is observed from an oblique viewing angle by a camera, for example, and appears deformed according to the surface contour of the wheel. The exact spatial position and contour of the wheel surface can be derived from the location and deformation of the light line received in the receiver. Also other technologies for determine the outer contour of the unloaded wheel are feasible, such as mechanical scanning with contact sensors or other contact methods or contactless method like ultrasonic scanning and so on. The technology used for scanning the wheel surface is not critical for the invention as long as it provides outer contour data of the wheel having sufficient accuracy.

According to a further aspect, the invention provides a vehicle service apparatus which comprises a system for determining the behavior or non-uniformities of a loaded wheel using simulation of the loading of the wheel with a virtual loading element and determined outer contour of the unloaded wheel together with a predetermined spring rate associated to the tyre tread, as set forth above. A scanning device of the apparatus used for other diagnostic purposes such as determining runout of the unloaded wheel, for example, can be used to provide the outer contour data of the unloaded wheel required for carrying out the invention. Also a computer device already incorporated in the vehicle service apparatus can be used to perform the load simulation according to the present invention by simply adding additional software features. Thus, a very convenient and cost effective method and apparatus for determining non-uniformities of a loaded wheel can be provided.

The vehicle service apparatus can be a wheel balancer, a tyre mounting/demounting apparatus or any other kind of wheel preparing/testing apparatus used for testing pre-mounted wheels in a vehicle assembling line of a vehicle manufacturer, for example.

According to a further aspect of the invention, the determined behavior or non-uniformities of the loaded wheel can be exploited and considered during the service operation carried out by the vehicle service apparatus. Thus, in a wheel balancer the position and magnitude of balancing weights can be corrected according to the determined behavior or non-uniformities in a wheel balancer operation. In a tyre mounting device, it is also possible to shift the angular mounting position of a tyre on the rim in accordance to the determined behavior or non-uniformities of the loaded wheel so as to mitigate or eliminate force variations and runout in radial and/or lateral direction by compensating rim runout with the determined tyre non-uniformities, for example, and vice versa.

In a further development of the invention, it is possible to display to an operator at least one of the determined outer contour, the load simulation results, the determined non-uniformities and a tyre diagnostic result. Then the operator can decide how to proceed with the wheel. For example, the operator can decide to repeat the simulation with changed parameters or with a higher precision, if a simple simulation has been performed using default parameters and/or the contour of only one radial cross-section of the tyre. The system or apparatus carrying out the invention can also provide indications whether the tyre or the rim is defective and should be replaced, or whether the rim/tyre combination should be remounted with shifted angular position to each other, for example.

According to a further aspect of the invention, a system for determining behavior or non-uniformities of a loaded wheel by means of simulation of loading of the wheel with a virtual loading element using determined outer contour of the unloaded wheel and a predetermined spring rate associated to the tyre tread can be integrated in a fully automatic wheel servicing apparatus capable of mounting/demounting and/or balancing a tyre/rim assembly.

According to a further embodiment of the invention, there is provided a computer program product comprising a computer readable medium carrying computer-readable instruction that, when carried out by a computer, enable the computer to carry out a method according to the invention.

According to a further independent aspect of the invention, there is provided a vehicle comprising a tyre or wheel behavior determination system according to the invention, wherein the vehicle is configured to use the information about behavior of a tyre or wheel obtained by the on-board system for informing the driver about wheel or tyre conditions, or for automatically adjusting a technical system of the vehicle, preferably the suspension system of the vehicle in order to improve driving characteristics of the vehicle.

According to a further independent aspect of the invention, there is provided an automotive service system, preferably a wheel alignment system, comprising a data processing device configured to receive, via a wired or wireless communication connection, data about tyre or wheel behavior from a vehicle comprising a tyre or wheel behavior determining system according to the invention, and to evaluate or use the data for a service operation, preferably for improving a wheel alignment process. Also other automotive service systems such as wheel balancers may be configured to receive and use the tyre or wheel behavior data from a vehicle having the tyre or wheel behavior determining system of the invention.

In the following, further advantages and embodiments of the inventive method and system are described in conjunction with the attached drawings. Thereby, the expressions left, right, below and above are referred to the drawings in an orientation of the drawings which allows the normal reading of the reference numbers.

DETAILED DESCRIPTION OF THE INVENTION

Figure 1:
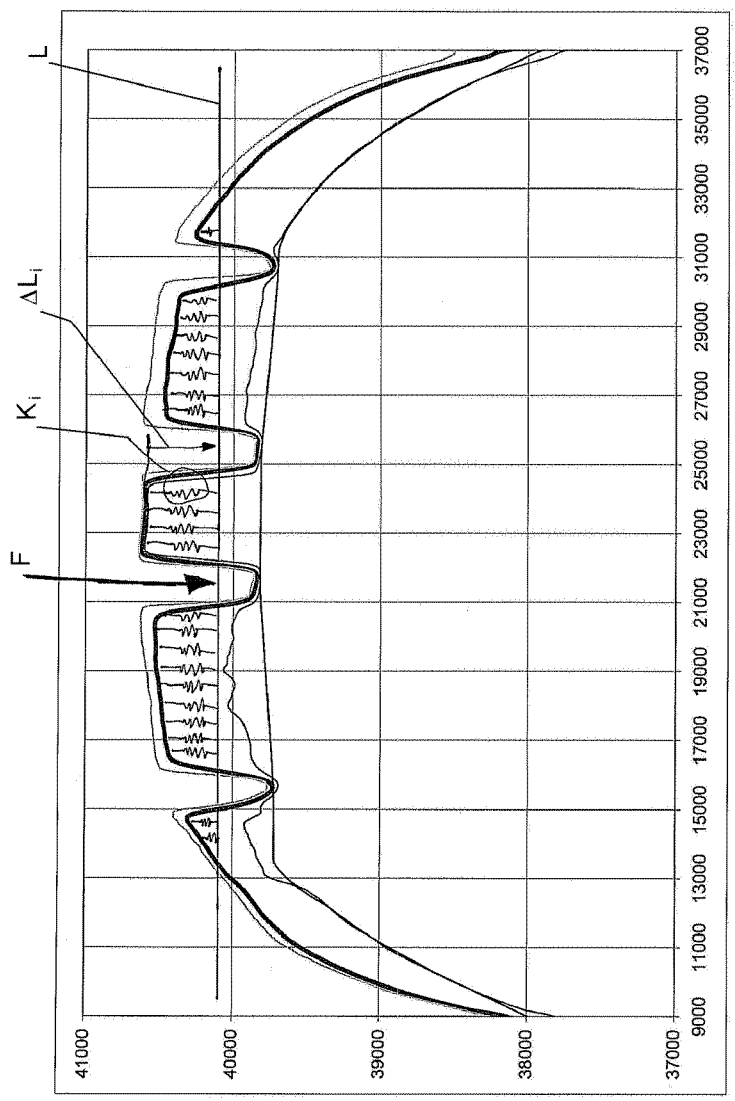
FIG. 1 is a diagram showing a portion of a determined outer contour of a radial cross-section of an unloaded wheel and a line L to which the outer contour will be de-formed under simulated loading.

In the following, out of the plurality of embodiments of the invention described above, only the most preferred embodiments are described with respect to the drawings. In particular, the method and the apparatus of the invention can be used as a stand-alone system, or in connection with or incorporated into any automotive shop servicing device such as a wheel balancer, a tyre mounting/demounting machine, a roller test bench for brake testing or a dynamometer, a wheel aligner system and so on. Furthermore, even if an outer contour of the tyre tread is shown in the drawings and described in the following explanations of the most preferred embodiments, the invention is not restricted to these specific embodiments as is clear from the other embodiments described above. The novel principle of the invention may be applied using the contour of various portions of the tyre determined in an unloaded or loaded state of the tyre, and using various virtual loading elements bearing against a variety of tyre portions. Thus, a great variety of tyre or wheel behavior may be determined by the simulation according to the invention.

A first preferred embodiment of the invention will be described in the following with respect to FIG. 1.

FIG. 1 shows a portion of an outer contour of a radial cross-section of an unloaded wheel. In FIG. 1, the x-axis represents an axial coordinate parallel to a wheel axis, while the y-axis represents a radial coordinate perpendicular to the wheel axis. The depicted portion comprises the tread surface and portions of the sidewalls of the tyre.

According to the method of the invention, it can be sufficient to scan and determine a portion of the wheel corresponding to that depicted in FIG. 1. However, it is also possible, and for some further developments of the invention described below it is favorable to determine at least the whole outer contour of the tyre and the junction of tyre and the rim, i.e. the rim edge. Furthermore, it is possible to scan and determine a substantial part of the outer contour of the rim, too.

For determining the outer contour of the unloaded wheel all around the circumference of the wheel, the wheel is rotated so that a scanning device scans the wheel surface by means of a laser beam, for example, in order to generate a three dimensional image (model) of the outer contour of the wheel. Laser devices capable of generating distance information and providing 3D contour data of a scanned wheel surface are known in the art. Other optical scanning devices using flat linear light beams generating lines of light on the wheel surface and evaluating images of the light lines deformed by the contour of the wheel surface are also known in the art, and are suitable for the purposes of the present invention. Such optical scanning devices as mentioned above are capable of providing outer contour of a scanned wheel with very high precision of several hundreds or thousands of detection points per radial cross-section. In circumferential direction of the wheel, preferably several hundred or more than thousand rotary positions of the wheel are scanned so that a sufficient number of radial cross-sections of the outer contour of the wheel can be determined.

After having determined the outer contour of the unloaded wheel, loading of the wheel (i.e. the rim/tyre assembly) with a virtual loading element is simulated. To this, the outer contour of a single radial cross-section as shown in FIG. 1, for example, is overlaid by a line L which is preferably parallel to the wheel axis. However, it is also possible to use a line L not parallel to the wheel axis to simulate asymmetric load which can result from a positive or negative camber of a wheel of a vehicle, for example. This line L represents the surface of a virtual loading element bearing against the tread of the tyre. In other words, it is assumed that the outer contour of the tyre tread is displaced and deformed such that the outer most portions of the tread, i.e. the lands between the tread grooves, coincide with the line L. The amount of displacement $\Delta L$, of the individual portions along the contour, represented by small symbolic springs in FIG. 1, can be determined by simple geometric subtraction of the spatial position data.

As mentioned above, it would be also possible to use the contour of other surface portions of a tyre, such as the inner contour of the tread portion of the tyre, for example. However, the simulation results usually are more precise when an outer contour is used comprising the tread portion of the tyre. An even better simulation result can be achieved when both the outer contour and the inner contour of a tyre are determined and used during simulation. Thus, the wall thickness of the respective tyre portions which has influence on the tyre stiffness, for example, can be taken into consideration. Determining the inner contour of a tyre portion may be accomplished by a scanning system able to scan the inner surface of a tyre before mounting the tyre onto a rim. For certain applications it is not necessary to mount the tyre onto a rim at all. In this case, only the tyre surface is scanned to determine the contour, preferably but not necessarily both the inner and the outer contour, of the tyre. Then the load simulation may be done by simulating loading the tyre with two virtual loading elements, one of which representing a virtual rim and the other representing a load roller of a road surface. Consequently, the virtual rim is bearing against the bead portions of the determined contour while the other virtual loading element is bearing preferably against the tread portion of the determined contour.

Using a predetermined spring rate K associated to the tyre tread as a parameter associated to the tyre, in particular an infinitesimal spring rate associated to the infinitesimal portions of the outer contour of the tread, an infinitesimal force F, can be calculated which is necessary to displace the infinitesimal tread portion until the outer contour coincides with the line L. To this, Hook's law $F=K\cdot\Delta L$ is used which describes the relationship between the displacement or deformation $\Delta L$ of a spring, the spring rate K and the force F applied to the spring.

It is preferred to maintain the detailed tread structure comprising lands and grooves unchanged, because the tread would not be deformed to such an extent that the tread profile would be completely planished. Rather, the calculation of the load simulation considers displacement of the whole tread section and only a coarse deformation reducing or eliminating curvature of the tread. Having calculated infinitesimal displacement forces F, for the individual tread contour portions under load, the total force F necessary to displace the tread contour to the line L can be calculated by summation or integration, respectively. This calculation may be represented by the equation $F=\Sigma(K\ \Delta L_i,)$. Optionally, to increase accuracy, it is possible to also consider a tread deformation in the axial direction, so that the axial displacement under load of the tread portions close to the sidewalls is taken into account.

The predetermined spring rate K can be a default value chosen for standard conditions or can be calculated according to known tyre parameters such as width, shoulder height, inflation pressure, tyre type (such as puncture proof tyres, run-flat tyres and so on), for example. These parameters can be input by an operator or can be detected by the device automatically (for example by evaluating scanning data of the scanning device).

Thus, a total load force F of the virtual loading element displacing the tyre tread of the wheel to a certain extent represented by the line L can be determined for the respective rotary position of the considered radial cross-section of the determined outer contour of the unloaded wheel.

This total load force F applied by the virtual loading element is then determined for a plurality of rotary positions using the corresponding determined radial cross-section of the outer contour of the wheel.

If, according to one embodiment of the invention, the simulated displacement of the tyre tread, i.e. the position of the line L, for the respective rotary positions of the wheel is varied and set such that a constant total force F is achieved for all rotary positions of the wheel, then a variation of tread displacement and/or a varying distance of the virtual loading element to the rotation axis of the wheel varying along the circumferential direction, i.e. a radial runout of the loaded wheel, can be determined.

If, according to another embodiment of the invention, the position of the line L with respect to the rotation axis of the wheel, i.e. the distance between the virtual loading element and the wheel axis, is kept constant and the resulting total force F for all rotary positions of the wheel is determined as described above, then a radial force variation of the loaded wheel can be determined.

An average outer contour of the whole tread (and optional additional portions of the tyre and the rim) may be determined from the scanning data in order to provide a basis to which the position of the line L is kept constant, if the position of the axis of the wheel is not available. Thus, the position of the rotation axis of the wheel may be calculated from the average outer contour of the wheel.

Having simulated loading of the wheel according to one of the embodiments described above, the behavior or non-uniformities of the loaded wheel can be determined.

Having simulated loading with a constant force F for all rotary positions of the wheel as described above, the calculated positions of the line L (representing the surface of the virtual loading element) with respect to the wheel axis can be used to determine the radial runout of the loaded wheel. This can be done by calculating the first harmonic of the deviation of the distance of the calculated position of the line L to the calculated position of the rotation axis of the wheel, for example. The magnitude (amplitude) of the first harmonic of that distance deviation is a measure for the radial runout of the loaded wheel. It is also possible to determine a measure for the radial runout of the loaded wheel by calculating a peak to peak difference of said distance of the positions of the line L to the rotation axis of the wheel.

Having simulated loading with a constant distance between the position of the line L and the rotation axis of the wheel for all rotary positions of the wheel, the calculated total load forces F of the virtual loading element for the respective rotary positions of the wheel can be used to determine a radial force variation of the loaded wheel. This can be done by calculating the first harmonic of a deviation of the forces F associated to the respective rotary positions of the wheel from an average value of all determined forces, for example. The magnitude (amplitude) of that first harmonic of the force deviation is a measure for the radial force variation (RFV) of the loaded wheel. It is also possible to determine a measure for the radial force variation of the loaded wheel by calculating a peak to peak difference of said deviation of the total load forces F associated to the respective rotary positions of the wheel.

In a further development of the invention, optionally a lateral force variation or lateral runout of the loaded wheel can be determined analogue to the simulation procedure described above. This is possible since the deviations of the determined outer contour of the unloaded wheel from an ideal shape can result in lateral forces if, for example, a conical or otherwise asymmetric tread position of the tyre with respect to the center plane of the wheel is determined. Using a lateral (axial) spring rate Ka associated to the tyre tread together with a predetermined relationship to a tread conicity, for example, enables determination of lateral forces and force variations and/or lateral runout of the loaded wheel on the basis of the determined outer contour of the unloaded wheel. Such a relationship may be determined empirically, or may be derived from a simulated deformation of the loaded wheel having such asymmetric tread portions. This is useful since lateral forces have significant influence on driving stability and in particular directional stability of a motor vehicle.

Moreover, also forces acting in circumferential direction of the tyre may be determined by the load simulation according to the invention. Variations of the rolling radius of a wheel result in varying circumferential forces. That varying circumferential forces also generate counter forces acting on the rotary axis of the wheel in a direction substantially perpendicular to the direction of the loading force.

Furthermore, for more a sophisticated evaluation of the tyre behavior under load, asymmetric loading with a line L not parallel to the wheel axis and/or a loading in a direction not perpendicular to the wheel axis resulting in displacement of tread portions in an axial direction may be considered, too. This enables consideration the suspension geometry of a vehicle, for example. The lateral spring rate Ka may be predetermined or may be derived from the spring rate K and/or other tyre parameters such as the width, shoulder height, inflation pressure and tyre type, for example.

In the embodiment described above, the spring rate K associated to the tyre tread is assumed to be constant all over the tyre tread. This may provide simulation results with sufficient accuracy for lower demands.

Figure 2:
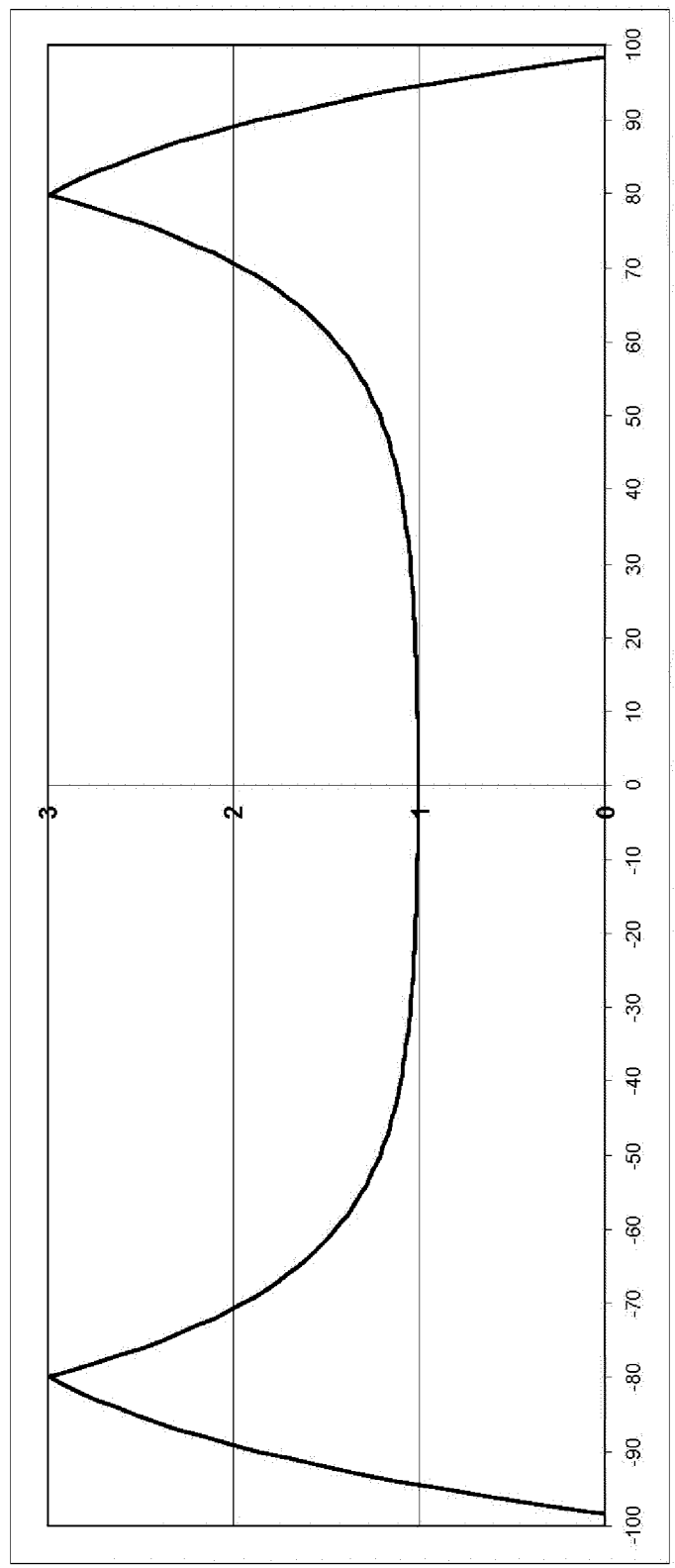
FIG. 2 is a diagram showing an example of weighting function used to vary the predetermined spring rate associated to the tyre tread in axial direction of the wheel.
Figure 3:
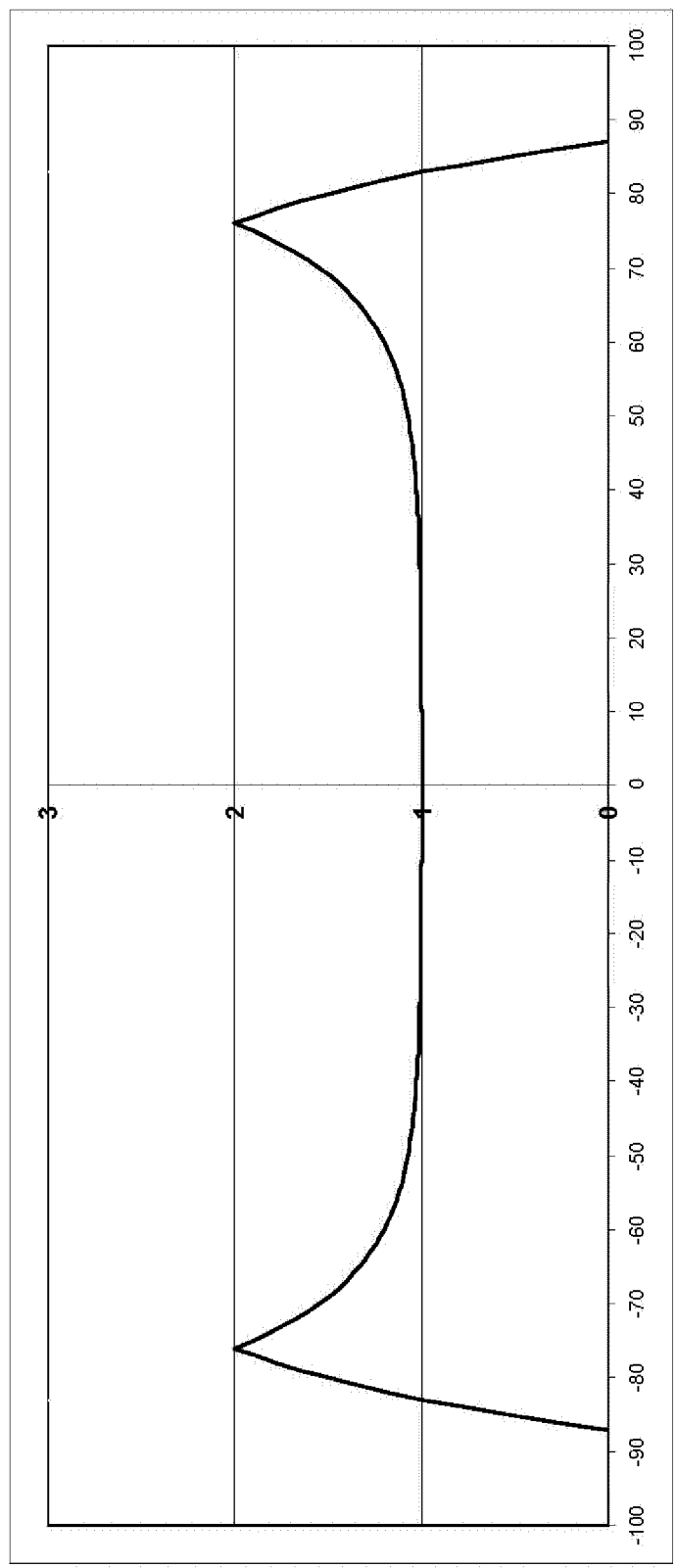
FIG. 3 is a diagram showing another example of weighting function used to vary the predetermined spring rate associated to the tyre tread in axial direction of the wheel.

In order to enhance the method and increase accuracy of the simulation results, according to another embodiment of the invention, the predetermined spring rate $K_i$ associated to the tyre tread can be defined as an infinitesimal spring rate K, varying in accordance to an axial position of an associated tread portion. Then the calculation of the total force F required to displace a tread contour to the line L, as mentioned above, may be represented by the equation $F=\Sigma_i (K_i \cdot \Delta L_i)$. This variation of the spring rate can be accomplished by a corresponding weighting function. Examples for such weighting functions are shown in FIGS. 2 and 3, in which the x-axis represents a centered tyre width in millimeter (mm), while the y-axis represents a weighing factor normalized to 1 in the center of the wheel width.

With such weighting functions, the stronger influence of the edge portions in axial direction of the tread on the tyre stiffness and spring rate can be taken into account to increase accuracy of the load simulation. The edge portion in axial direction of the tread in general are stiffer, i.e. have a higher spring rate, because of the influence of the sidewalls of the tyre which are deformed when the edge portions of the tread are displaced. This can be compensated by a stronger (higher) spring rate at the edges of the tyre tread which normally engage with the loading element later, i.e. with larger tread displacements and higher total load forces, similar to the radial cross-sections of the outer contour adjacent to the considered radial cross-section of the respective rotary position of the wheel.

Furthermore and independent from the above embodiment, the predetermined spring rate K associated to the tyre tread can be an infinitesimal spring rate $K_1$, which varies in accordance to a radial position of an associated tread portion of the unloaded wheel. Also this variation of the spring rate can be accomplished by a corresponding weighting function (not shown). Besides a compensation effect for the contribution of the adjacent radial cross-sections of the outer contour of the wheel similar to the weighting functions described in the previous paragraph, a deviation of the tyre contour from a perfect circular circumference resulting from non-uniformities of the tyre structure can be taken into account to increase accuracy of the load simulation. Such non-uniformities in the tyre structure can result in tyre stiffness variations. Therefore, there is a relationship between the unloaded radial position of a tread portion and its associated spring rate which can be taken into account with a weighting function varying the spring rate in accordance to the radial position of the tread portion of the unloaded tyre.

Furthermore, in a further development of the invention, the predetermined spring rate can be a non-linear infinitesimal spring rate varying in accordance to a displacement of the tyre tread caused by the simulated loading. In this manner, it can be provided a compensation for the fact that displacement of a tread portion in the beginning (i.e. small displacement) is influenced mainly by local geometrical deformations of the tyre material, while with larger displacements of the tread, other factors such as the tyre inflation pressure and the tyre sidewall deformation gain influence with different strength. In this manner, accuracy of the load simulation can be increased. Also this spring rate variation can be accomplished by a corresponding weighting function and is able to compensate several aspects mentioned above, such as the contribution of adjacent radial cross-sections of the outer contour of the wheel bearing a part of the total load force F.

Of course, a combination the above mentioned weighting functions can be used in order to better comply with real conditions of wheel loading.

It is also possible to use other parameters than the above mentioned spring rate as the parameter associated to the tyre, in order to calculate a force resulting from the displacement of a tyre portion caused by the virtual loading element. Examples for such other parameters are factored in displacements of the contour caused by the virtual loading element until a certain condition is met. Such a condition may be, for example, reaching of a stable radial force variation value around the circumference of the tyre, obtaining of a first harmonic or elimination of the same, or elimination of harmonics of higher grade. The simulation algorithm is capable to consider an arbitrary displacement of the contour depending on arbitrary conditions.

In a further embodiment of the invention, the step of determining the outer contour of the wheel can comprise determining a radial runout and/or a lateral runout of the rim. To this, preferably at least an outer contour of the tyre and a portion of the rim, in particular the rim edge, are scanned and determined. The position of the tyre beads can be determined on the basis of the detected positions of the rim edges. Thus, radial or lateral runout of the rim can be considered in load simulation. Knowledge of radial or lateral runout of the rim enables to separate the effects of the rim and the effects of the tyre on the determined outer contour of the unloaded wheel and also on the determined non-uniformities of the loaded wheel. This results in an increase of accuracy of load simulation, and furthermore, an angular remount position of the rim/tyre assembly in order to mitigate or eliminate radial or lateral runout of the rim/tyre assembly can be determined, for example.

Figure 6:
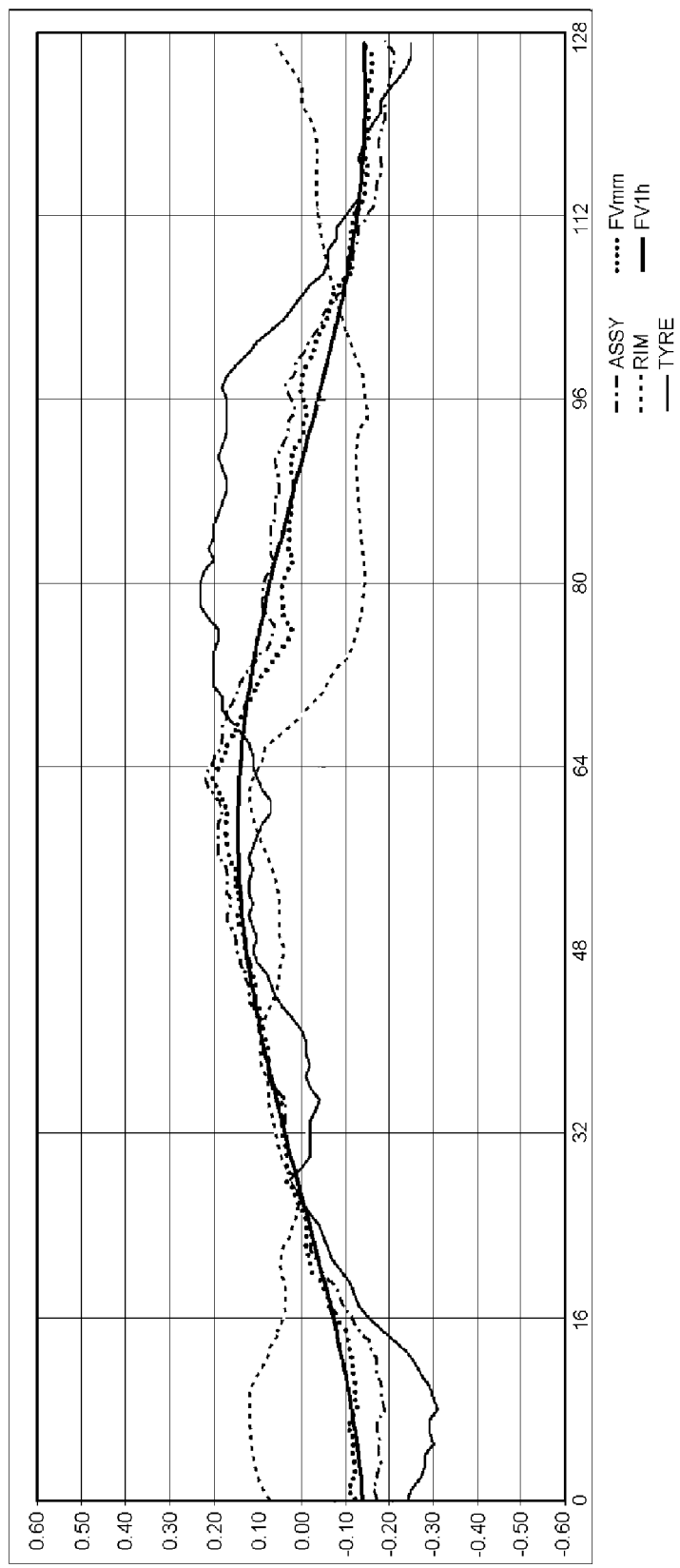
FIG. 6 is a diagram showing an example of separation between effects generated by the wheel rim and effects generated by the wheel tyre.

FIG. 6 shows an example of determined behavior or non-uniformities of a loaded wheel according to one of the above mentioned embodiments of the invention. In the diagram of FIG. 6, the line marked with ASSY represents the determined radial runout of the wheel, i.e. the rim/tyre assembly. The line marked with RIM represents the determined radial runout of the wheel rim. The line marked with TYRE represents the contribution of the tyre to the radial runout of the rim/tyre assembly calculated from the lines ASSY and RIM by subtraction, for example. The line marked with FVmm represents the radial force variation of the wheel (rim/tyre assembly) calculated from rim runout and tyre runout and considering the respective contributions of the rim and the tyre to the radial force variation. To this, additionally a rim spring rate can be taken into account, even if it is not necessary since the spring rate of the rim is in general much higher than that of the tyre so that loading the wheel with usual forces does not result in substantial rim deformation. The line marked with FV1h represents the calculated first harmonic of the radial force variation. This first harmonic can be used to determine a standard measure for the radial force variation. Another possibility is using peak to peak values as a measure for radial force variation, as already mentioned above.

Figure 4:
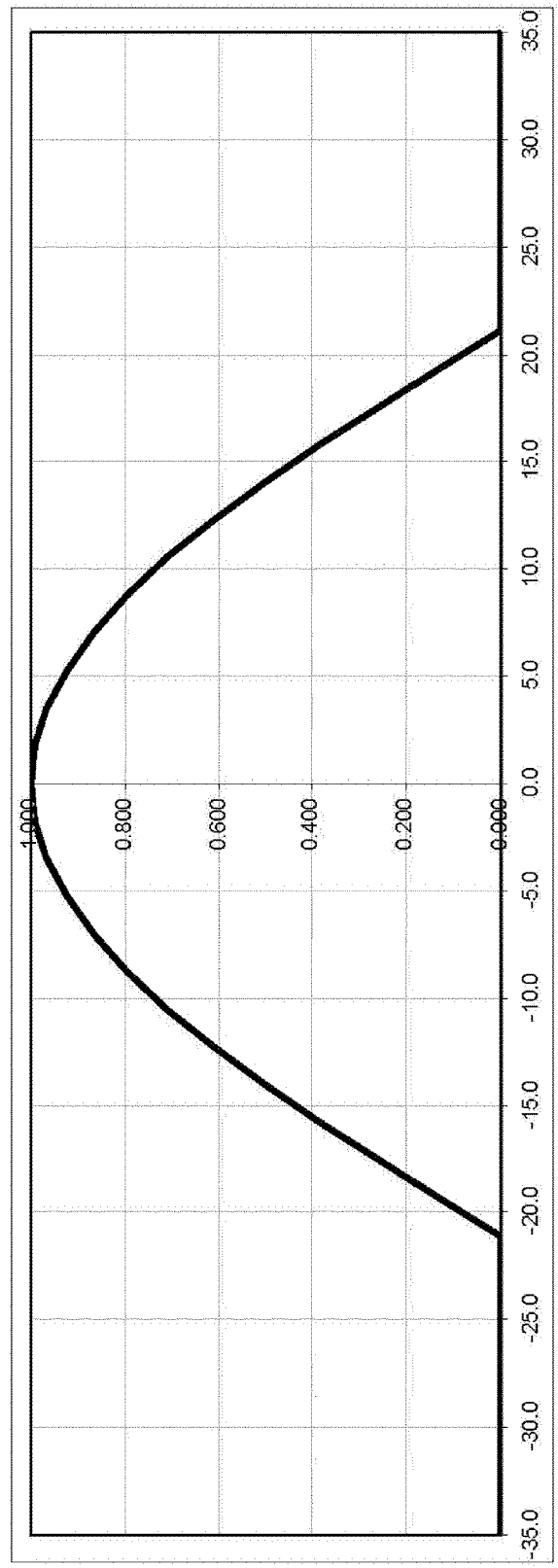
FIG. 4 is a diagram showing an example of a weighting function used to vary simulated tyre tread displacement along a circumference of a virtual load roller.
Figure 5:
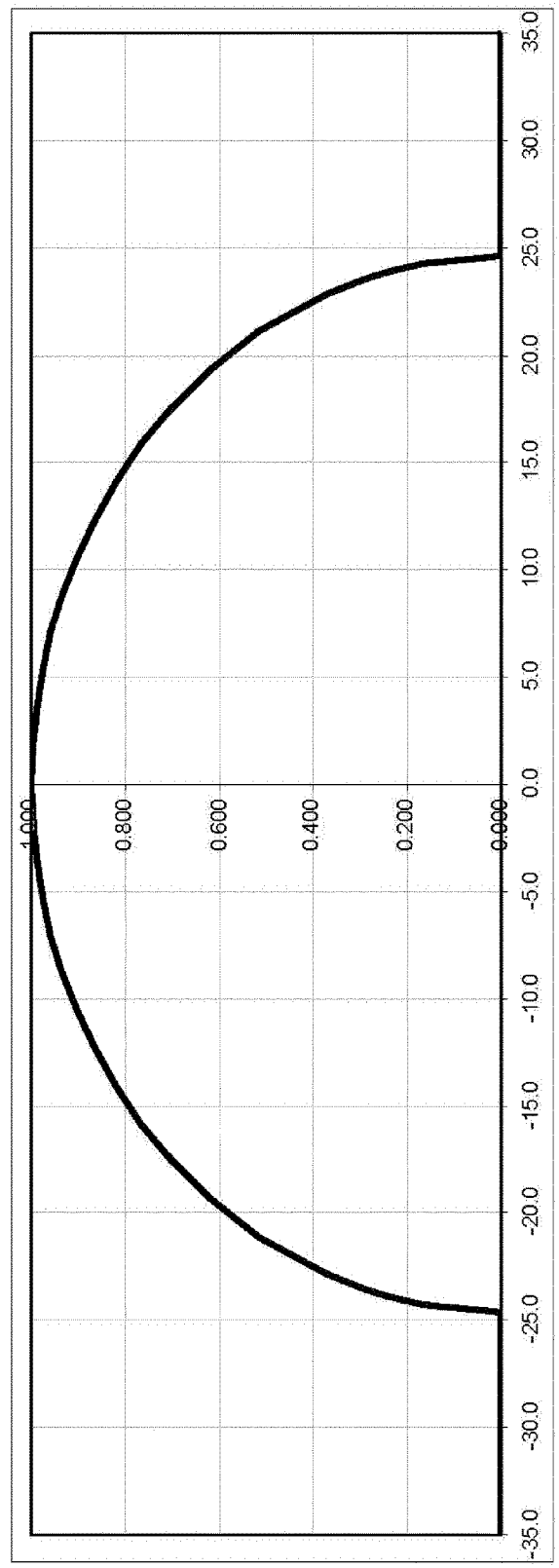
FIG. 5 is a diagram showing an example of another weighting function used to vary simulated tyre tread displacement along a circumference of another virtual load roller.

In a further developed embodiment of the invention, determined outer contour of a plurality of adjacent radial cross-sections of the wheel can be used to simulate loading of the wheel by considering a contact area between the virtual loading element and the tyre tread. In this manner, a more accurate load simulation can be achieved based on a more realistic tyre deformation due to load. Thus, loading of the wheel with virtual loading elements having different shape can be simulated. To this, determined outer contour of several adjacent radial cross-sections of the wheel are used and weighted with a weighting function as shown in FIGS. 4 and 5, for example. The diagrams in FIGS. 4 and 5 show weighting functions applied to the spring rate K associated to the respective tread portions of the tyre, wherein the x-axis represents an angle (in degrees) of the contact area in circumferential direction of a virtual load roller and the y-axis represents the weighting value normalized to 1 in the center of the contact area.

According to another embodiment of the invention, within the contact area between the tyre tread and the surface of the virtual loading element different displacement and/or different contact pressure of different tread portions can be considered in load simulation. For example, load rollers with different diameters can be used for the virtual loading element. It is also possible to use a flat plane for the virtual loading element. Such a plane can represent a road surface. This enables to simulate loading of the wheel close to real operation conditions of a wheel running on a road surface. To further enhance simulation and increase accuracy of the results, also in this method of using a simulation of a contact area one or more of appropriate weighting functions described above in connection with FIGS. 2 to 5 can be used additionally.

According to another embodiment of the invention, a system for determining behavior or non-uniformities of a loaded wheel comprising a rim and a tyre mounted to the rim is provided. The system comprises a scanning device for scanning the surface of the tyre or wheel, and a computer device connectable to the scanning device. Thus, the scanning device and the computer device can be separate devices. It is also possible to upgrade an existing vehicle wheel servicing apparatus, such as a wheel aligner or a tyre changer, for example, by adding said scanning device to apparatus and enhancing the computer device already present in the apparatus by adding additional software features enabling the apparatus to perform a method according to the present invention.

The computer device controls the scanning device and receives from the scanning device three dimensional data representing the surface contour of the wheel. The computer device uses default values or can use measured or input values for the required parameters to perform the load simulation and the determination of behavior or non-uniformities of the loaded wheel. Such parameters can be, for example, a tyre inflation pressure, rim and tyre dimensions, rim and tyre type, and average spring rate K of the tyre tread, for example. The computer device is able to correct the spring rate associated to the tyre tread according to the above mentioned parameters by varying the default values or by varying the weighting functions applied to the spring rate. Thus, a very precise simulation and very accurate values of the determined behavior or non-uniformities can be achieved.

According to another embodiment of the invention, the system and the method of the invention described above can be integrated into a vehicle service apparatus. Thus, a very convenient and cost effective method and apparatus for determining behavior or non-uniformities of a loaded wheel can be provided, while the results of the determination can be used during a service operation performed by the servicing apparatus.

The invention claimed is:

1. A method for operating a system comprising a scanning device and a processor for determining a behavior of a loaded tyre or wheel comprising a rim and a tyre mounted to the rim, the method comprising the steps of:
    determining, with the processor, a contour of at least a portion of the tyre or wheel obtained by the scanning device,
    simulating, with the processor, loading of the tyre or wheel with at least one virtual loading element bearing against the tyre for at least one rotary position of the tyre or wheel on the basis of the determined contour, a displacement of the determined contour caused by the virtual loading element, and at least one parameter associated to the tyre or wheel or to a portion of the tyre, and determining, with the processor, the behavior of the loaded tyre or wheel using the simulation results.

2. The method according to claim 1, wherein the behavior comprises at least one of a force exerted between the tyre and the virtual loading element, a force exerted between the tyre and the rim, a force exerted by the rim or wheel on a rotary axis of the wheel, a deformation or displacement of the tyre or of a portion of the tyre, a deformation of the rim, a variation of one of said forces or deformations or displacements with respect to a plurality of load simulations relating to a plurality of rotary positions of the tyre or wheel.

3. The method according to claim 2, wherein said force or deformation or displacement is determined in at least one of a radial direction, a lateral direction, and a circumferential direction with respect to the tyre or wheel.

4. The method according to claim 2, wherein the behavior comprises at least one of an average, a peak to peak value, a first harmonic, and a higher harmonic of at least one of said variations of said forces or deformations or displacements.

5. The method according to claim 1, wherein the at least one parameter associated to the tyre or wheel or to a part of the tyre comprises at least one of a spring rate associated to the rim, a filling pressure of the tyre, a spring rate associated to the tyre, a spring rate associated to a portion of the tyre, a displacement of the determined contour caused by the virtual loading element, a wall thickness of respective portions of the tyre, a deformation of the determined contour caused by the virtual loading element.

6. The method according to claim 1, wherein the contour comprises at least a portion of an outer contour of the tyre.

7. The method according to claim 1, wherein the portion of the tyre or wheel comprises at least a part of the tread portion of the tyre.

8. The method according to claim 1, wherein the step of simulating loading for a respective rotary position of the tyre or wheel comprises simulating a plurality of different load conditions, wherein the different load conditions comprise one or both of: different or varying load magnitudes and different or varying values of the at least one parameter associated to the tyre or wheel or to a part of the tyre.

9. The method according to claim 8, wherein the step of simulating further comprises determining a simulation result for each respective rotary position of the tyre or wheel on the basis of a plurality of simulations of different load conditions.

10. The method according to claim 1, wherein the step of simulating comprises a simulated loading of the wheel with a predetermined force exerted by the virtual loading element, and wherein the step of determining the behavior comprises determining radial runout of the loaded wheel.

11. The method according to claim 1, wherein the step of simulating comprises a simulated loading of the wheel with a predetermined distance between the virtual loading element and a rotation axis of the wheel, and wherein the step of determining the behavior comprises determining radial force variation of the loaded wheel.

12. The method according to claim 1, wherein the step of determining the behavior further comprises determining at least one of lateral force variation or lateral runout of the loaded wheel.

13. The method according to claim 1, wherein the at least one parameter is an infinitesimal spring rate varying in accordance to at least one of an axial position and a radial position of an associated tread portion.

14. The method according to claim 1, wherein the at least one parameter is a non-linear infinitesimal spring rate varying in dependence of a displacement of a tread of the tyre caused by the loading element.

15. The method according to claim 1, wherein said at least one parameter is corrected according to at least one of a tyre type, a tyre size, a tyre inflation pressure, a rim type, a displacement of the virtual loading element, a displacement or deformation of the determined contour caused by the loading element, a kind of a vehicle, a vehicle weight, a repartition of the vehicle weight on the axles of the vehicle, a suspension geometry of the vehicle, precise model data of the vehicle.

16. The method according to claim 1, wherein the step of determining the contour of the tyre or wheel comprises determining at least one of a radial runout and a lateral runout of the rim, and wherein the step of simulating comprises consideration of the determined runout of the rim.

17. The method according to claim 1, wherein the step of simulating uses the determined contour of a single radial cross-section of the tyre or wheel.

18. The method according to claim 1, wherein the step of simulating uses the determined contour of a plurality of adjacent radial cross-sections of the tyre or wheel to simulate a contact area between the virtual loading element and the tyre.

19. The method according to claim 18, wherein the simulated contact area is a contact area between the tyre and a virtual load roller having a certain radius, or between the tyre and a virtual load belt having a certain sagging radius, or between the tyre and a plane surface such as a road surface.

20. The method according to claim 19, wherein the contact area of the tyre and a respectively shaped virtual loading element is simulated by applying a respective weighting function to the simulations of a respective adjacent radial cross sections of the tyre or wheel.

21. The method according to claim 1, wherein at least two virtual loading elements are used simultaneously, and wherein one virtual loading element represents a virtual rim bearing against beads of the tyre while another virtual loading element is bearing against a tread of the tyre.

22. The method according to claim 1, wherein the loading of the tyre or wheel with the virtual loading element is controlled in dependence of one of a group of vehicle parameters, including: overall vehicle weight, repartition of the vehicle weight on each vehicle axle, kind of vehicle, and suspension geometry.

23. A system for determining a behavior of a loaded tyre or wheel comprising a rim and a tyre mounted to the rim, the system comprising:

a scanning device for scanning a contour of the tyre or wheel or of a portion of the tyre, and a computer device connectable to the scanning device and configured to carry out the method according to claim 1.

24. The system according to claim 23, wherein the scanning device comprises an optical scanner configured for contactless sensing the surface of the tyre or wheel and providing three dimensional contour data of at least a portion of the tyre or wheel.

25. The system according to claim 23, wherein the system is a portable stand-alone device.

26. The system according to claim 23, wherein the system is mounted on board of a vehicle.

27. The system according to claim 23, wherein the system is part of a wheel or tyre test equipment.

28. A vehicle service apparatus, the apparatus comprising a system according to claim 23.

29. The vehicle service apparatus according to claim 28, wherein the apparatus is a wheel balancer, a tyre mounting/demounting apparatus, a roller test bench, a tyre test stand or a wheel test stand.

30. The vehicle service apparatus according to claim 28, wherein the determined behavior of the loaded tyre or wheel is considered during a service operation carried out by the vehicle service apparatus.

31. A non-transitory computer readable medium including computer-readable instructions that, when executed by a computer, enable the computer to carry out a method according to claim 1.

32. A vehicle comprising a system according to claim 26, wherein the vehicle is configured to use the information about behavior of a tyre or wheel obtained by the on-board system to inform the driver about wheel or tyre conditions, or to automatically adjust a technical system of the vehicle.

33. An automotive service system comprising:

a data processing device configured to receive data about tyre or wheel behavior from a vehicle according to claim 32 via a wired or wireless communication connection, and to evaluate or use the data for a service operation.

34. The method according to claim 1, wherein the step of simulating loading for a respective rotary position of the tyre or wheel comprises simulating a plurality of different load conditions, wherein the different load conditions comprise different or varying values of the at least one parameter associated to the tyre or wheel or to a part of the tyre.

* * * * *